(12) United States Patent
Xhakoni

(10) Patent No.: US 12,531,569 B2
(45) Date of Patent: Jan. 20, 2026

(54) ANALOG-TO-DIGITAL CONVERTER CIRCUIT AND ANALOG-TO-DIGITAL CONVERSION METHOD

(71) Applicant: ams Sensors Belgium BVBA, Berchem (BE)

(72) Inventor: Adi Xhakoni, Kessel Lo (BE)

(73) Assignee: ams Sensors Belgium BVBA, Berchem (BE)

( * ) Notice: Subject to any disclaimer, the term of this patent is extended or adjusted under 35 U.S.C. 154(b) by 87 days.

(21) Appl. No.: 18/682,119

(22) PCT Filed: Aug. 25, 2022

(86) PCT No.: PCT/EP2022/073688
§ 371 (c)(1),
(2) Date: Feb. 8, 2024

(87) PCT Pub. No.: WO2023/025892
PCT Pub. Date: Mar. 2, 2023

(65) Prior Publication Data
US 2024/0333294 A1 Oct. 3, 2024

(30) Foreign Application Priority Data
Aug. 26, 2021 (DE) .......................... 102021122132.3

(51) Int. Cl.
*H03M 1/12* (2006.01)
(52) U.S. Cl.
CPC .................................. *H03M 1/122* (2013.01)

(58) Field of Classification Search
CPC ........ H03M 1/123; H03M 1/14; H04N 25/77; H04N 25/772
See application file for complete search history.

(56) References Cited

U.S. PATENT DOCUMENTS

| 9,807,334 B1 * | 10/2017 | Moeneclaey | ........... H03M 1/56 |
| 2011/0292261 A1 * | 12/2011 | Hwang | .................. H04N 25/78 |
| | | | 348/294 |

(Continued)

OTHER PUBLICATIONS

German Search Report for corresponding German Application No. 102021122132.3 dated Apr. 19, 2022, 10 pages (for informational purposes only).

(Continued)

*Primary Examiner* — Mirza F Alam
(74) *Attorney, Agent, or Firm* — Viering, Jentschura & Partner mbB

(57) ABSTRACT

An ADC circuit includes a comparator with a first input for receiving an analog signal and with a second input for receiving a ramp signal, a first output of the comparator, a second output of the comparator, a first counter connected to the first output, a second counter connected to the second output, a first clock connected to the first counter, and a second clock connected to the second counter. The first clock provides a first clock signal to the first counter, the second clock provides a second clock signal to the second counter, the first counter is configured to count with the frequency of the first clock signal, the second counter is configured to count with the frequency of the second clock signal. The frequency of the first clock signal is lower than the frequency of the second clock signal.

13 Claims, 2 Drawing Sheets

(56) References Cited

U.S. PATENT DOCUMENTS

| | | |
|---|---|---|
| 2015/0028190 A1 | 1/2015 | Shin et al. |
| 2015/0194973 A1* | 7/2015 | Furuta ................... H04N 25/767 |
| | | 341/122 |
| 2020/0044659 A1 | 2/2020 | Li |
| 2020/0044660 A1* | 2/2020 | Xhakoni ............. H03M 1/0617 |
| 2023/0110124 A1* | 4/2023 | Li ............................ G06F 1/04 |
| | | 341/126 |

OTHER PUBLICATIONS

Ma, Cheng et al., "A low power counting method in ramp ADCs used in CMOS Image sensors", 4 pages.

Shiraishi, Kei et al., "A 1.2e-Temporal Noise 3D-Stacked CMOS Image Sensor with Comparator-Based Multiple-Sampling PGA", 2016 IEEE International Solid-State Circuits Conference, Japan, 2016, pp. 122-124.

* cited by examiner

ANALOG-TO-DIGITAL CONVERTER CIRCUIT AND ANALOG-TO-DIGITAL CONVERSION METHOD

CROSS-REFERENCE TO RELATED APPLICATIONS

The present application is a U.S. National Stage Application of International Application PCT/EP2022/073688, filed on Aug. 25, 2022 and claims the priority of the German application DE 10 2021 122 132.3, filed Aug. 26, 2021, the entire disclosures of the above-listed applications are hereby incorporated by reference.

FIELD

Various embodiments of the present disclosure relate to an analog-to-digital converter circuit and an analog-to-digital conversion method.

BACKGROUND

Image sensors usually comprise an array of unit elements, called pixels. The array of pixels is exposed to radiation during an exposure period and, subsequently, the signal value of each pixel is read from the array. Pixel signals are analog signals. An analog-to-digital converter (ADC) is provided to convert the analog pixel signal into a digital signal. The ADCs are a major building block in image sensors and are often the bottleneck in the readout block of the imagers in terms of power consumption. Ramp based ADCs are widely used due to their limited number of column circuitry, and small die size.

SUMMARY

Various embodiments of the present disclosure relate to an ADC circuit that can be operated efficiently and to an efficient analog-to-digital (AD) conversion method.

According to at least one embodiment of the ADC circuit, the ADC circuit comprises a comparator with a first input for receiving an analog signal and with a second input for receiving a ramp signal. The analog signal can be provided by a sensor or a pixel of an imaging device. The ADC circuit can be connected to the sensor or the pixel of the imaging device. The analog signal can be an electric voltage. The comparator can be configured to receive the analog signal at its first input. The ramp signal can be provided by a ramp generator. The ADC circuit can be connected to the ramp generator. It is also possible that the ADC circuit comprises the ramp generator. The second input of the comparator is connected to the ramp generator. The comparator can be configured to receive the ramp signal at its second input. The ramp signal can comprise electric voltages. The ramp signal can have the shape of a ramp. This means, the ramp signal can be linearly increasing or linearly decreasing.

The comparator can be configured to provide a comparison signal based on a comparison of the analog signal with the ramp signal. This means, the comparator is configured to compare the analog signal with the ramp signal. This comparison can be started by starting the ramp of the ramp signal. This means, the comparison can be started by providing a linearly increasing or linearly decreasing ramp signal to the second input of the comparator. The point in time when the comparison of the analog signal with the ramp signal by the comparator is started is referred to as a first starting time.

The ADC circuit further comprises a first output of the comparator. The first output can be configured to provide a first output signal. The first output signal can be an output signal of the comparator.

The ADC circuit further comprises a second output of the comparator. The second output can be configured to provide a second output signal. The second output signal can be an output signal of the comparator.

The ADC circuit further comprises a first counter connected to the first output. The first counter is configured to count clock cycles once it is activated or enabled. Once the first counter is deactivated or disabled it does not count any clock cycles. The first counter can be configured to provide the number of counted clock cycles.

The ADC circuit further comprises a second counter connected to the second output. The second counter is configured to count clock cycles once it is activated or enabled. Once the second counter is deactivated or disabled it does not count any clock cycles. The second counter can be configured to provide the number of counted clock cycles.

The ADC circuit further comprises a first clock connected to the first counter. The first clock is configured to provide a first clock signal to the first counter. The first clock signal has a frequency. The first counter is configured to count with the frequency of the first clock signal.

The ADC circuit further comprises a second clock connected to the second counter. The second clock is configured to provide a second clock signal to the second counter. The second clock signal has a frequency. The second counter is configured to count with the frequency of the second clock signal.

The frequency of the first clock signal is lower than the frequency of the second clock signal. This means, the first counter counts slower than the second counter.

The ADC circuit can be employed to read out data provided by a pixel of an image sensor. This means, the ADC circuit can be employed to convert an analog signal provided to the ADC circuit into a digital signal. This is achieved by a counting process in which the analog signal is compared to the ramp signal. Typically, the resolution of an ADC relates to the frequency of a clock signal employed in the counting process. A conversion with the resolution of N bits performed by a state of the art converter typically requires 2 to the power of N clock cycles of the clock used within the converter, where N is a natural number. The higher the number of clock cycles required for the conversion the higher is the power consumption of the ADC circuit.

With the ADC circuit described herein the power consumption can be reduced. This is achieved by employing the first counter and the second counter. The first counter is employed to count at a lower frequency, namely the frequency of the first clock signal, which means that each count of the first counter relates to a first voltage range of the analog signal. The second counter is employed to count at a higher frequency, namely the frequency of the second clock signal, which means that each count of the second counter relates to a second voltage range of the analog signal. The second voltage range is smaller than the first voltage range. Thus, the first counter is employed to provide a conversion with a resolution of the first voltage range. The second counter is employed to provide a conversion with the resolution of the second voltage range within the conversion provided by the first counter. This is achieved by activating the second counter later than the first counter. In this way, it is not necessary to count the whole voltage range of the analog signal with the frequency of the second clock signal but only a certain voltage range of the analog signal. Thus, the total number of required counts is reduced significantly. At the same time a conversion is achieved with the resolution determined by the second clock signal.

In other words, not all the voltage ranges that are typically required to be counted for a given resolution of the converted signal are counted by the ADC circuit. Instead, the second counter is only started later than the first counter and the second counter does not count within the whole voltage range of the analog signal but only within a part of the voltage range of the analog signal.

The converted signal can be provided by the ADC circuit as an N bit binary number. This means, the binary number comprises N bits. The binary number consists of most significant bits (MSB) and least significant bits (LSB). For example, a 10 bit binary number can consist of 5 MSBs and 5 LSBs. With the ADC circuit described herein the MSBs are determined by the first counter and the LSBs are determined by the second counter. This means, with the counting of the first counter the MSBs are defined and with the counting of the second counter the LSBs are defined. Therefore, for a resolution of N bits of the conversion a number equal the sum of 2 to the power of the number of MSBs and 2 to the power of the number of LSBs of clock cycles is required. Thus, the total number of required clock cycles is given by the sum of the number of clock cycles required to determine the MSBs and the number of clock cycles required to determine the LSBs. This means, for the example of 10 bits where the binary number comprises 5 MSBs and 5 LSBs a number of $2^5+2^5=64$ clock cycles is required. If only one counter is employed as in a typical setup, $2^{10}=1024$ clock cycles are required for a 10 bit resolution. This means, with the ADC circuit described herein the number of required clock cycles can be reduced significantly while keeping the same resolution. A reduced number of required clock cycles leads to a reduced power consumption. Therefore, the ADC circuit can be operated efficiently.

The power consumption can be reduced by a factor of at least 5 in comparison to an ADC circuit with only one counter. At the same time the resolution and the accuracy can be kept at the same level as with only one counter.

It is also possible to provide the converted signal as any other N bit binary number. Furthermore, the MSBs and the LSBs can be distributed differently in comparison the example described above.

It is possible to employ the ADC circuit for correlated double sampling (CDS). In CDS an analog reset signal and an actual analog signal of a sensor or a pixel are converted by the ADC circuit. Both the analog reset signal and the actual analog signal are provided after one another to the first input of the comparator. Both analog signals can be converted into a digital signal by the ADC circuit as described above. The signal to be determined is then the difference between the two digital signals.

According to at least one embodiment of the ADC circuit the first output is configured to provide a first output signal that toggles once the ramp signal has reached the level of the analog signal at a stopping time. This can mean, that the first output signal has a first value before it toggles and that it has a second value after it toggled where the first value is different from the second value. At the stopping time the first output signal changes from the first value to the second value. The stopping time is the point in time when the ramp signal has reached the level of the analog signal. The analog signal is a constant value and the ramp signal changes with time. When the values of the analog signal and of the ramp signal are equal the stopping time is reached. The first output signal is employed to define the point in time when the second counter starts to count. The second counter starts to count once the first clock signal changed its state after the stopping time. In this way, the second counter starts with a delay in comparison to the first counter. This enables to reduce the number of counts required for the conversion significantly which leads to a reduction in power consumption. The first counter can be configured to be deactivated at the stopping time. In this way, only the number of clock cycles of the first clock signal is counted that is required for a digitalizing the analog signal.

According to at least one embodiment of the ADC circuit the second counter is configured to be activated once the first clock signal has changed its state after the stopping time. That the second counter is activated means that the second counter starts to count. The first clock signal can be a signal which has two different states, namely a first state and a second state. The first clock signal changes between the two different states with the frequency of the first clock signal. For example, the first clock signal is a square wave signal. The two different states of the first clock signal can be different voltages. A change of the state of the first clock signal refers to a change from either the first state to the second state or a change from the second state to the first state. The second counter can be configured to be activated once the first clock signal has changed its state for the first time after the stopping time. This means, that the second counter is activated at that point in time when the first clock signal changes its state for the first time after the stopping time. It is also possible that the second counter is configured to be activated once the first clock signal has changed its state for the second time after the stopping time. The point in time when the second counter is started is referred to as a second starting time. With the start of the second counter after the start of the first counter it is possible to significantly reduce the number of counts required for the conversion.

According to at least one embodiment of the ADC circuit the second output is configured to provide a second output signal that toggles at a delayed stopping time which is delayed by a delay in comparison to the stopping time. This can mean, that the second output signal has a first value before it toggles and that it has a second value after it toggled where the first value is different from the second value. The delay can be introduced by a delay element. This means, the delay element can be configured to delay the toggling of the second output signal. The delay element can be comprised by the comparator. The delay element can comprise an inverter. At the delayed stopping time the second output signal changes from the first value to the second value. The delayed stopping time is a point in time after the stopping time. The delay is the length of the time span between the stopping time and the delayed stopping time. At the delayed stopping time the second counter is deactivated. This means, the second counter is counting between the second starting time and the delayed stopping time. Consequently, with the second output signal the point in time is defined when the second counter is deactivated. Advantageously, the second counter is not counting voltage steps in the whole range of the analog signal but only within a part of the range of the analog signal. In this way, the total number of required counts for the conversion can be significantly reduced.

According to at least one embodiment of the ADC circuit the delay amounts to at least one period of the first clock signal. One period of the first clock signal is the time between a change from the first state to the second state and the next change from the first state to the second state. This means, one period of the first clock signal is equal to one clock cycle of the first clock signal. The delay is equal to at least one period of the first clock signal. With a delay of one clock cycle of the first clock signal the second counter only counts the voltage range that cannot be resolved by the first counter. From the first counter it is not clear at which point in time during one period of the first clock signal the first output signal toggles. After the toggling of the first output signal the second output signal does not toggle for at least one whole period of the first clock signal. This one period of the first clock signal is the delay. It is also possible that the delay is longer than one period of the first clock signal, however the minimum necessary length of the delay is one period of the first clock signal. During the delay the second counter is started at a defined point in time, namely at the second starting time. The number of counts of the second counter between the second starting time and the delayed stopping time relates to the information at which point in time during one period of the first clock signal the first output signal toggled. This means, the number of clock cycles of the second clock signal between the second starting time and the delayed stopping time is equal to the number of clock cycles of the second clock signal within the time span of the period of the first clock signal within which the first output signal toggled between the toggling of the first output signal and the start of that period of the first clock signal. In other words, the time between the second starting time and the delayed stopping time is equal to the length of time between the toggling of the first output signal and the start of the clock cycle of the first clock signal during which the toggling of the first output signal occurs. The second counter is therefore employed to determine with a higher resolution than the first counter the length in time between the start of the period of the first clock signal within which the first output signal toggles and the point in time when the first output signal toggles.

In order to obtain the digitalized value of the analog signal from the first counter and the second counter it is necessary to subtract the length of the delay from the sum of the counts of the first counter and the second counter. In order to determine the delay, the delay is for example measured. As the second counter is only counting between the second starting time and the delayed stopping time, the time during which the second counter is counting is reduced significantly. Thus, the power consumption of the ADC circuit is reduced.

According to at least one embodiment of the ADC circuit the first counter is configured to be activated at the time when the ramp signal is provided to the second input of the comparator. This means, the first counter is configured to be activated at the time when a linearly increasing or linearly decreasing ramp signal is provided to the second input of the comparator. In other words, the first counter is configured to be activated once the ramp of the ramp signal starts. Thus, the first counter is configured to be activated at the first starting time. Once the first counter is activated it starts to count. Therefore, the first counter starts to count when the comparison of the ramp signal to the analog signal starts. In this way, the first counter can be employed for digitalizing the analog signal.

According to at least one embodiment of the ADC circuit the frequency of the second clock signal is n times the frequency of the first clock signal, wherein n is a natural number. n is larger than 1. n can for example be 2, 4, 8 or 16. Thus, the second clock signal has a higher frequency than the first clock signal which leads to a higher resolution of the second count.

According to at least one embodiment of the ADC circuit the second counter is connected to the first counter and to the first output. In this way, the information when the first output signal toggles and the first clock signal can be provided to the second counter. From this information the second starting time, thus the time at which the second counter is activated, can be determined.

Furthermore, an AD conversion method is provided. The ADC circuit can be employed for the AD conversion method described herein. This means all features disclosed for the ADC circuit are also disclosed for the AD conversion method and vice-versa.

According to at least one embodiment of the AD conversion method, the method comprises providing an analog signal to a first input of a comparator. The analog signal can be provided by an external device connected to an ADC circuit which is configured to carry out the AD conversion method. The external device can be a sensor or a pixel of an image sensor.

The method further comprises providing a ramp signal to a second input of the comparator. The ramp signal can be provided by a ramp generator.

The method further comprises starting of a comparison of the analog signal to the ramp signal by the comparator at a first starting time. This means, at the first starting time the comparator starts to compare the analog signal to the ramp signal.

The method further comprises activating a first counter at the first starting time, wherein the first counter is configured to count with the frequency of a first clock signal. The first clock signal can be provided by a first clock.

The method further comprises activating of a second counter at a second starting time, wherein the second counter is configured to count with the frequency of a second clock signal. The second clock signal can be provided by a second clock.

The second starting time is reached when the ramp signal has reached the level of the analog signal at a stopping time and the first clock signal has changed its state after the stopping time. Thus, the second counter is activated after the first counter. The frequency of the first clock signal is lower than the frequency of the second clock signal.

With the AD conversion method an analog signal can be converted into a digital signal in an efficient way. For this purpose the second counter is started after the first counter. Furthermore, the second counter does not count within the whole voltage range of the analog signal but only within a part of the voltage range of the analog signal. In this way, the number of counted clock cycles required for the digitalization of the analog signal can be reduced significantly in comparison to an AD conversion method where only one counter is employed or where the employed counters count within the whole voltage range of the analog signal. A reduced number of clock cycles leads to a reduced power consumption. Therefore, the AD conversion method is efficient.

According to at least one embodiment of the AD conversion method, a first output signal is provided by a first output of the comparator, wherein the first output signal toggles at the stopping time and the first counter is connected to the first output. The first output signal can be provided to the first counter. The first counter can be deactivated at the stopping time. Thus, the first output signal can be employed to control the first counter.

According to at least one embodiment of the AD conversion method, the first counter is deactivated after the stopping time. Thus, the first counter is employed to count the clock cycles during the comparison of the analog signal to the ramp signal. As the frequency of the first clock signal is lower than the frequency of the second clock signal, the first counter can efficiently count the clock cycles during the comparison of the analog signal to the ramp signal. This means, counting the clock cycles during the comparison of the analog signal to the ramp signal with the second counter would require significantly more clock cycles than counting with the first counter. The first counter can be deactivated once it changed its state after the stopping time. It is also possible that the first counter is deactivated when the clock cycle that was started before the stopping time ended.

According to at least one embodiment of the AD conversion method, the second counter is deactivated at a delayed stopping time which is after at least one period of the first clock signal passed after the stopping time. This means, the second counter is deactivated after at least one period of the first clock signal passed after the stopping time. This means, the second counter is deactivated after the first counter is deactivated. The delay of the second counter enables an efficient AD conversion.

According to at least one embodiment of the AD conversion method, a second output signal is provided by a second output of the comparator, wherein the second output signal toggles at the delayed stopping time and the second counter is connected to the second output. The first output signal can be provided to the first counter. The second counter is deactivated at the delayed stopping time. Thus, the second output signal can be employed to control the second counter. The toggling of the second output signal is determined by the toggling of the first output signal and the delay. This means, the second output signal toggles after the delay passed after the toggling of the first output signal. This control of the first counter via the first output signal and the control of the second counter by the second output signal enables an efficient AD conversion.

According to at least one embodiment of the AD conversion method, the steps of the method are carried out for a further analog signal provided to the first input of the comparator after the delayed stopping time, where the further analog signal is different from the analog signal. This means, the AD conversion method can be employed for correlated double sampling (CDS). In this case, the analog signal can be an analog reset signal and the further analog signal can be an actual analog signal of a sensor or a pixel or vice versa. The further analog signal is provided to the first input of the comparator after the second counter stopped counting clock cycles for digitalizing the analog signal. Then the further analog signal is converted into a digital signal in the same way as the analog signal. The delay is the same for the method carried out for the analog signal and the method carried out for the further analog signal.

According to at least one embodiment of the AD conversion method, an output is provided which is given by the difference between an output determined from the method carried out for the further analog signal and an output determined from the method carried out for the analog signal. The outputs can each comprise a digital signal. This means, the method is carried out for the analog signal and as an output a digital signal is provided. Afterwards, the method is carried out for the further analog signal and as an output a digital signal is provided. The signal to be determined is then the difference between the two digital signals. This means, in this provided output the reset level is subtracted from the actual analog signal. In this way, the delay cancels out in the subtraction as the delay is the same for the analog signal and the further analog signal.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

Figure 2:
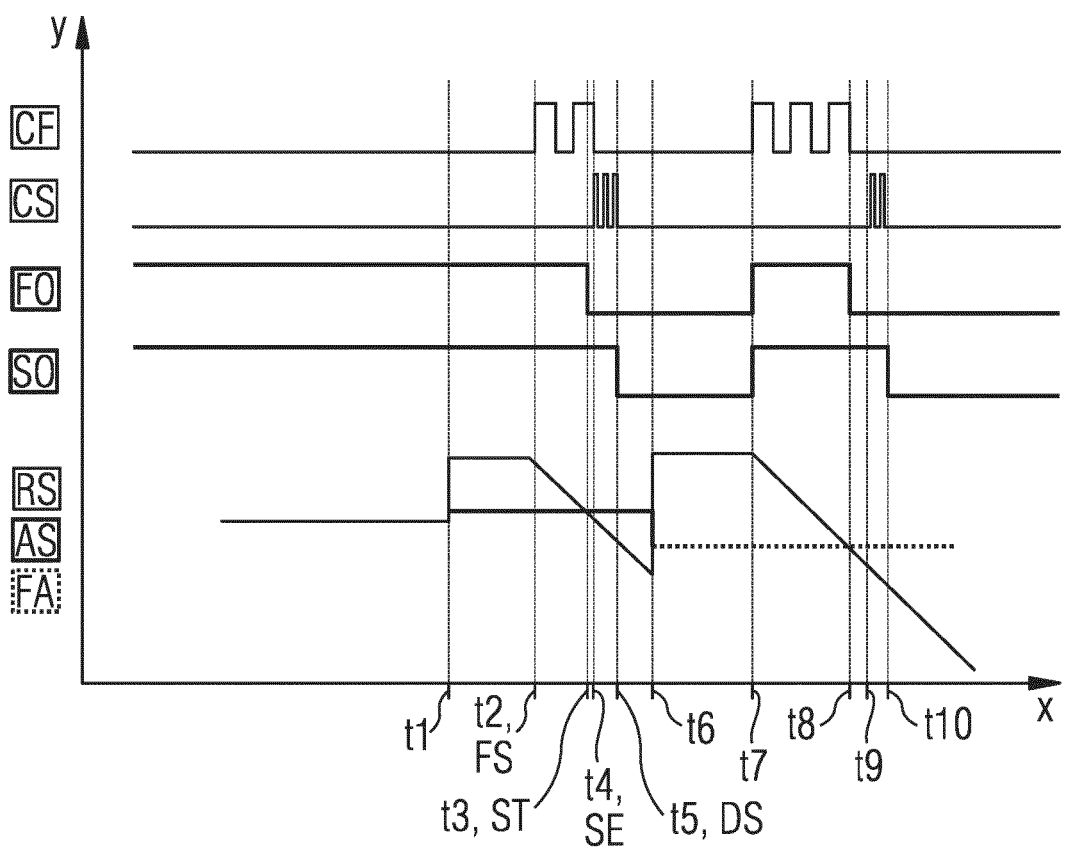
Figure 3A:
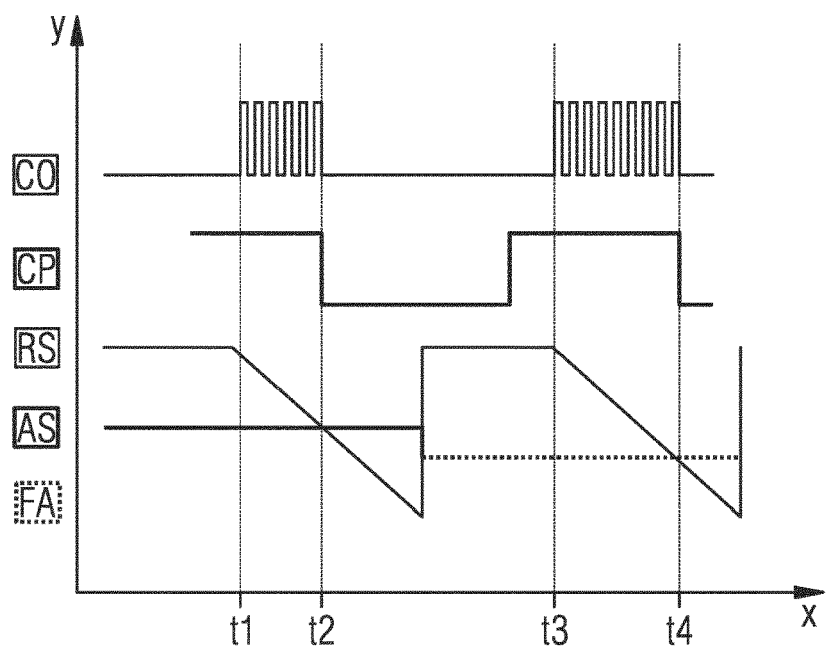
Figure 3B:
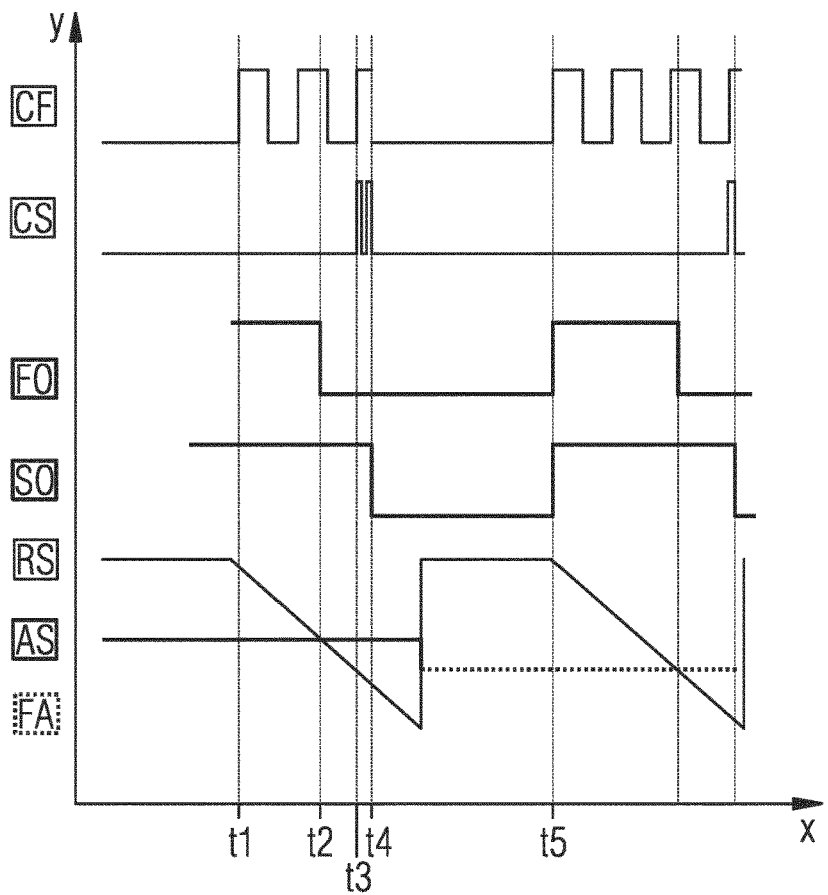

With FIGS. 2, 3A and 3B show exemplary embodiments of an AD conversion method.

DETAILED DESCRIPTION

Figure 1:
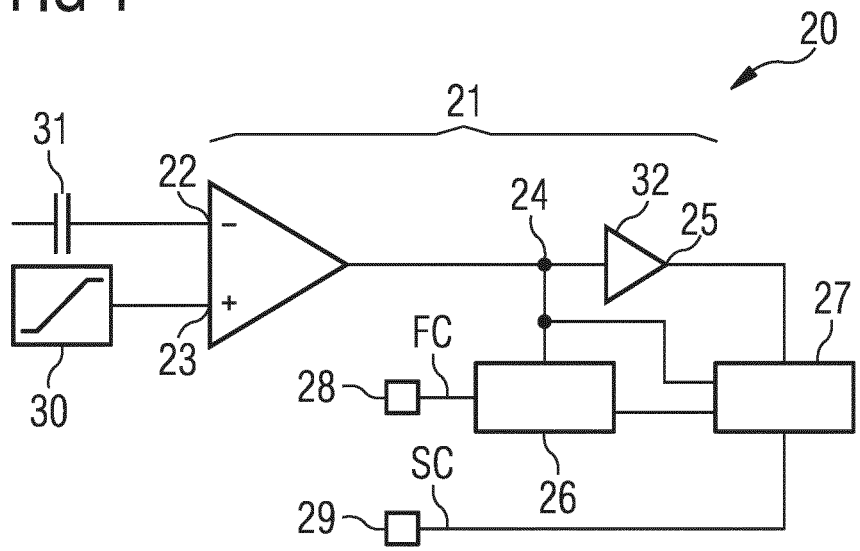
FIG. 1 shows an exemplary embodiment of the ADC circuit.

FIG. 1 shows an exemplary embodiment of an ADC circuit 20. The ADC circuit 20 comprises a comparator 21 with a first input 22 for receiving an analog signal AS and a second input 23 for receiving a ramp signal RS. The analog signal AS can be provided to the first input 22 via a capacitor 31 connected to the first input 22 or the analog signal AS can be provided to the first input 22 in another way. The capacitor 31 is optional. The ramp signal RS is provided to the second input 23 via a ramp generator 30 connected to the second input 23.

The comparator 21 comprises a first output 24 and a second output 25. The second output 25 is connected to the first output 24. The first output 24 is configured to provide a first output signal FO and the second output 25 is configured to provide a second output signal SO. The first output signal FO toggles once the ramp signal RS has reached the level of the analog signal AS at a stopping time ST. The second output signal SO toggles at a delayed stopping time DS which is delayed by a delay in comparison to the stopping time ST. The comparator 21 further comprises a delay element 32. The delay element 32 is configured to delay the second output signal SO so that the second output signal SO toggles at the delayed stopping time DS. The second output 25 is arranged at an output of the delay element 32 or is connected to an output of the delay element 32. The delay element 32 can comprise an inverter. It is also possible that the delay element 32 is a separate component and not comprised by the comparator 21.

The ADC circuit 20 further comprises a first counter 26 that is connected to the first output 24 and a second counter 27 that is connected to the second output 25. Furthermore, the second counter 27 is connected to the first output 24 and the second counter 27 is connected to the first counter 26. However, the connection between the second counter 27 and the first output 24 is optional.

The ADC circuit 20 further comprises a first clock 28 that is connected to the first counter 26 and a second clock 29 that is connected to the second counter 27. The first clock 28 is configured to provide a first clock signal FC to the first counter 26 and the second clock 29 is configured to provide a second clock signal SC to the second counter 27. The first counter 26 is configured to count with the frequency of the first clock signal FC and the second counter 27 is configured to count with the frequency of the second clock signal SC. The frequency of the first clock signal FC is lower than the frequency of the second clock signal SC. The frequency of the second clock signal SC is n times the frequency of the first clock signal FC, wherein n is a natural number.

The second counter 27 is configured to be activated once the first clock signal FC has changed its state after the stopping time ST. The first counter 26 is configured to be activated at the time when the ramp signal RS is provided to the second input 23 of the comparator 21. The delay amounts to one period of the first clock signal FC.

With FIG. 2 an exemplary embodiment of the AD conversion method is described. FIG. 2 shows a diagram where the time is plotted on the x-axis and different signals are plotted above each other on the y-axis. According to the AD conversion method at first a first point in time t1 an analog signal AS is provided to the first input 22 of the comparator 21. The analog signal AS is shown in the bottom line of the diagram. At the same time a ramp signal RS is provided to the second input 23 of the comparator 21. Furthermore, the ramp signal RS is set to a starting value.

At a second point in time t2 the ramp signal RS is provided to the second input 23 of the comparator 21. From the second point in time t2 on the ramp signal RS linearly decreases. Thus, at the second point in time t2 the comparison of the analog signal AS to the ramp signal RS by the comparator 21 is started. The second point in time t2 is referred to as a first starting time FS. At the first starting time FS the first counter 26 is activated. This means, at the first starting time FS the first counter 26 starts to count with the frequency of the first clock signal FC. At the first starting time FS the first counter 26 starts to provide a first counting signal CF which is shown in the top line in the diagram. In the example in FIG. 2 the first counting signal CF shows two clock cycles of the first clock signal FC.

At a third point in time t3 a first output signal FO toggles. This is the point in time when the ramp signal RS has reached the level of the analog signal AS. The third point in time t3 is referred to as the stopping time ST. The first output signal FO is provided by the first output 24 of the comparator 21. The first counter 26 is connected to the first output 24. The first counter 26 stops counting when the clock cycle that was started before the stopping time ST and ended after the stopping time ST ended. This means, the first counter 26 is deactivated with the end of the clock cycle of the first clock signal FC that was started before the stopping time ST. In the example in FIG. 2 the first counter 26 is deactivated shortly after the stopping time ST.

The second counter 27 is activated at a fourth point in time t4. The fourth point in time t4 is referred to as the second starting time SE. The second starting time SE is reached when the ramp signal RS has reached the level of the analog signal AS at the stopping time ST and the first clock signal FC has changed its state after the stopping time ST. This means, the second counter 27 is activated once the first counting signal CF has changed its state after the stopping time ST since the first counting signal CF shows counts of the first counter 26 using the first clock signal FC. That the first counting signal CF has changed its state means that it changed from one level to another level. Here, the second starting time SE is reached when the ramp signal RS has reached the level of the analog signal AS at the stopping time ST and the first clock signal FC has changed its state for the first time after the stopping time ST. The second counter 27 counts with the frequency of the second clock signal SC. In the example in FIG. 2 the frequency of the second clock signal SC is four times the frequency of the first clock signal FC.

At a fifth point in time t5 a second output signal SO provided by the second output 25 of the comparator 21 toggles. The fifth point in time t5 is referred to as the delayed stopping time DS. The second counter 27 is connected to the second output 25. The second counter 27 is deactivated at the delayed stopping time DS. The delayed stopping time DS is reached when one period of the first clock signal FC passed after the stopping time ST. In other embodiments it is also possible that the delayed stopping time DS is reached when a time span passed after the stopping time ST which time span is longer than one period of the first clock signal FC.

In the example in FIG. 2 the first counter 26 counted two clock cycles. During the second clock 29 cycle that the first counter 26 counted the stopping time ST is reached. From the first counter 26 it is not clear at which point in time during the second clock 29 cycle the stopping time ST is reached. Due to the delayed starting of the second counter 27 in comparison to the first counter 26, the second counter 27 determines the length of time between the start of the second clock 29 cycle of the first counter 26 and the stopping time ST. The second counter 27 determines this length of time after the stopping time ST. In the example in FIG. 2 the second counter 27 counts three clock cycles of the second clock signal SC. Thus, the second counting signal CS shows three clock cycles. With the second counter 27 a higher resolution can be achieved than with the first counter 26. However, this higher resolution is only determined for the last clock cycle of the first counter 26. Thus, it is not necessary for the second counter 27 to count all the clock cycles up to the last clock cycle of the first counter 26. In this way, significantly less clock cycles are required for the conversion of the analog signal AS. Consequently, the power consumption is reduced and the efficiency is increased.

At a sixth point in time t6 the ramp of the ramp signal RS ends. Furthermore, after the sixth point in time t6 the analog signal AS is no longer provided to the first input 22 of the comparator 21. The AD conversion method can end at this point in time. It is also possible that further steps of the method follow as described below.

After the sixth point in time t6 the AD conversion method is carried out for a further analog signal FA in the same way as for the analog signal AS. The further analog signal FA is also provided to the first input 22 of the comparator 21. The further analog signal FA is different from the analog signal AS. The analog signal AS can be an analog reset signal and the further analog signal FA can be an actual analog signal AS of a sensor or a pixel. This means, the AD conversion method can be employed for CDS.

A seventh point in time t7 for the further analog signal FA corresponds to the second point in time t2 for the analog signal AS. An eighth point in time t8 corresponds to the third point in time t3. A ninth point in time t9 for the further analog signal FA corresponds to the fourth point in time t4 for the analog signal AS. A tenth point in time t10 for the further analog signal FA corresponds to the fifth point in time t5 for the analog signal AS. For the further analog signal FA three cycles of the first clock signal FC are counted by the first counter 26 and two cycles of the second clock signal SC are counted by the second counter 27.

Finally, an output is provided by the difference between the output determined from the method carried out for the further analog signal FA and an output determined from the method carried out for the analog signal AS. This means, the output is the difference between the number of clock cycles counted for the further analog signal FA and the number of clock cycles counted for the analog signal AS. As the two outputs are subtracted from each other, the delay cancels, since the delay is the same for the analog signal AS and the further analog signal FA. Thus, the delay can be chosen arbitrary.

With FIGS. 3A and 3B another exemplary embodiment of the AD conversion method is described. In FIG. 3A a diagram of an AD conversion method which is no embodiment is shown. In the diagram the time is plotted on the x-axis and different signals are plotted above each other on the y-axis. In this AD conversion method only one counter is employed. The ramp signal RS, the analog signal AS and the further analog signal FA are provided to a comparator 21 employed in the method in the same way as described above. These three signals are shown in the bottom of the diagram. In the top line of the diagram a counting signal CO of the counter is shown. At a first point in time t1 the ramp of the ramp signal RS starts and the comparison of the ramp signal RS with the analog signal AS starts. At the same time the counter starts to count. Thus, the counting signal CO shows clock cycles of a clock connected to the counter. At a second point in time t2 the ramp signal RS reaches the level of the analog signal AS and a comparator output signal CP toggles. Therefore, the counter stops counting. From the number of clock cycles counted by the counter between the first point in time t1 and the second point in time t2 the analog signal AS can be converted. The method is carried out again for the further analog signal FA and the counter counts again between a third point in time t3 and a fourth point in time t4. The signal to be obtained is the difference between the number of clock cycles counted for the further analog signal FA (9) and the number of clock cycles counted for the analog signal AS (6), thus 3.

In FIG. 3B a diagram of an exemplary embodiment of the AD conversion method is shown. In the diagram the time is plotted on the x-axis and different signals are plotted above each other on the y-axis. At a first point in time t1 the comparison between the ramp signal RS and the analog signal AS starts. Furthermore, the first counter 26 starts to count at the first point in time t1. Thus, the first point in time t1 is the first starting time FS. At a second point in time t2 the ramp signal RS reaches the level of the analog signal AS. Thus, the second point in time t2 is the stopping time ST. At the stopping time ST the first output signal FO toggles. At a third point in time t3 the second counter 27 starts to count. At this point in time the first clock signal FC has changed its state for the second time after the stopping time ST. The first counter 26 counts with the frequency of the first clock signal FC. Thus, at the third point in time t3 also the first counting signal CF has changed its state for the second time after the stopping time ST. The third point in time t3 is the second starting time SE. At a fourth point in time t4 the second output signal SO toggles. At the same time the second counter 27 is deactivated and also the first counter 26 is deactivated. Thus, the fourth point in time t4 is the delayed stopping time DS. At a fifth point in time t5 the AD conversion method is carried out for the further analog signal FA in the same way as for the analog signal AS. For both the analog signal AS and the further analog signal FA the delay is equal to one clock cycle of the first clock signal FC.

The frequency of the second clock signal SC is four times the frequency of the first clock signal FC. For the analog signal AS two clock cycles are counted by the first counter 26 and two clock cycles are counted by the second counter 27. One clock cycle counted by the first counter 26 corresponds to four clock cycles counted by the second counter 27. Thus, in total ten clock cycles of the second counter 27 are counted for the analog signal AS. For the further analog signal FA three clock cycles are counted by the first counter 26 and one clock cycle is counted by the second counter 27. Thus, in total 13 clock cycles of the second counter 27 are counted for the further analog signal FA. The signal to be obtained is the difference between the number of clock cycles counted for the further analog signal FA and the number of clock cycles counted for the analog signal AS, thus 3. The result is thus the same as obtained by the method shown with FIG. 3A, however with the method shown in FIG. 3B less clock cycles are required for the conversion. In FIG. 3A 15 clock cycles are required and in FIG. 3B only 8 clock cycles are required. In this way, the power consumption is reduced significantly. Here, a very low resolution is chosen for demonstration. The reduction of the power consumption by a factor of at least 5 can be achieved with a higher resolution.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art. The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

REFERENCES

20 Analog-to-digital converter circuit
21 comparator
22 first input
23 second input
24 first output
25 second output
26 first counter
27 second counter
28 first clock
29 second clock
30 ramp generator
31 capacitor
32 delay element
AS analog signal
CF first counting signal
CO counting signal
CP comparator output signal
CS second counting signal
DS delayed stopping time
FA further analog signal
FC first clock signal
FO first output signal
FS first starting time
RS ramp signal
SC second clock signal
SE second starting time
SO second output signal
ST stopping time
t1-t10 points in time

The invention claimed is:

1. An analog-to-digital converter circuit comprising:
   a comparator with a first input for receiving an analog signal and with a second input for receiving a ramp signal,
   a first output of the comparator,
   a second output of the comparator,
   a first counter connected to the first output,
   a second counter connected to the second output,
   a first clock connected to the first counter, and
   a second clock connected to the second counter, wherein
- the first clock is configured to provide a first clock signal to the first counter,
- the second clock is configured to provide a second clock signal to the second counter,
- the first counter is configured to count with the frequency of the first clock signal,
- the second counter is configured to count with the frequency of the second clock signal, and
- the frequency of the first clock signal is lower than the frequency of the second clock signal
- the first output is configured to provide a first output signal that toggles once the ramp signal has reached the level of the analog signal at a stopping time, and
- the second counter is configured to be activated once the first clock signal has changed its state after the stopping time.

2. The analog-to-digital converter circuit according to claim 1, wherein the second output is configured to provide a second output signal that toggles at a delayed stopping time which is delayed by a delay in comparison to the stopping time.

3. The analog-to-digital converter circuit according to claim 2, wherein the delay amounts to at least one period of the first clock signal.

4. The analog-to-digital converter circuit according to claim 1, wherein the first counter is configured to be activated at the time when the ramp signal is provided to the second input of the comparator.

5. The analog-to-digital converter circuit according to claim 1, wherein the frequency of the second clock signal is n times the frequency of the first clock signal, wherein n is a natural number.

6. The analog-to-digital converter circuit according to claim 1, wherein the second counter is connected to the first counter and to the first output.

7. A method for analog-to-digital conversion, the method comprising:
- providing an analog signal to a first input of a comparator,
- providing a ramp signal to a second input of the comparator,
- starting of a comparison of the analog signal to the ramp signal by the comparator at a first starting time,
- activating a first counter at the first starting time, wherein the first counter is configured to count with the frequency of a first clock signal, and
- activating of a second counter at a second starting time, wherein the second counter is configured to count with the frequency of a second clock signal, wherein
- the second starting time is reached when the ramp signal has reached the level of the analog signal at a stopping time and the first clock signal has changed its state after the stopping time, and
- the frequency of the first clock signal is lower than the frequency of the second clock signal.

8. The method according to claim 7, wherein a first output signal is provided by a first output of the comparator, wherein the first output signal toggles at the stopping time and the first counter is connected to the first output.

9. The method according to claim 7, wherein the first counter is deactivated after the stopping time.

10. The method according to claim 7, wherein the second counter is deactivated at a delayed stopping time which is after at least one period of the first clock signal passed after the stopping time.

11. The method according to claim 10, wherein a second output signal is provided by a second output of the comparator, wherein the second output signal toggles at the delayed stopping time and the second counter is connected to the second output.

12. The method according to claim 7, wherein method is carried out for a further analog signal provided to the first input of the comparator after the delayed stopping time, where the further analog signal is different from the analog signal.

13. The method according to the claim 12, wherein an output is provided which is given by the difference between an output determined from the method carried out for the further analog signal and an output determined from the method carried out for the analog signal.

* * * * *